United States Patent
Shen

(10) Patent No.: US 8,415,805 B2
(45) Date of Patent: Apr. 9, 2013

(54) ETCHED WAFERS AND METHODS OF FORMING THE SAME

(75) Inventor: Hong Shen, Camarillo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 297 days.

(21) Appl. No.: 12/971,465

(22) Filed: Dec. 17, 2010

(65) Prior Publication Data

US 2012/0153476 A1    Jun. 21, 2012

(51) Int. Cl.
*H01L 23/48* (2006.01)

(52) U.S. Cl.
USPC ............ 257/774; 257/E21.023; 257/E21.231; 438/717

(58) Field of Classification Search .......... 438/553, 438/618, 629, 671, FOR. 315, 700, 713, 717, 438/736, 738; 257/750, 774, E21.023, E21.231, 257/E21.257, E21.314, E21.364
See application file for complete search history.

(56) References Cited

U.S. PATENT DOCUMENTS

| | | |
|---|---|---|
| 6,431,432 B1 | 8/2002 | McCormick et al. |
| 6,492,269 B1 | 12/2002 | Liu et al. |
| 6,495,019 B1 | 12/2002 | Filas et al. |
| 6,596,635 B1 | 7/2003 | Tiku et al. |
| 6,870,243 B2 | 3/2005 | Elliott et al. |
| 6,908,856 B2 * | 6/2005 | Beyne et al. ................. 438/667 |
| 6,939,800 B1 | 9/2005 | Lu et al. |
| 6,982,441 B2 | 1/2006 | Yamaki et al. |
| 7,012,019 B2 * | 3/2006 | Hsu et al. ....................... 438/618 |
| 7,923,842 B2 | 4/2011 | Shen et al. |
| 2002/0048889 A1 | 4/2002 | Hayama et al. |
| 2002/0093101 A1 | 7/2002 | Iyer et al. |
| 2003/0015721 A1 | 1/2003 | Slater et al. |
| 2003/0020174 A1 | 1/2003 | Kohno |
| 2003/0141593 A1 | 7/2003 | Zuniga-Ortiz et al. |
| 2004/0129991 A1 | 7/2004 | Lai et al. |
| 2004/0176053 A1 | 9/2004 | Yamashita |
| 2005/0085084 A1 | 4/2005 | Chang et al. |
| 2005/0127480 A1 | 6/2005 | Elliot et al. |
| 2005/0157476 A1 | 7/2005 | Goudarzi |
| 2006/0290002 A1 | 12/2006 | Arana et al. |
| 2007/0066054 A1 | 3/2007 | Uzoh et al. |
| 2007/0210340 A1 | 9/2007 | Zampardi |
| 2008/0088020 A1 | 4/2008 | Miyajima et al. |
| 2009/0045514 A1 | 2/2009 | Ishizaka et al. |
| 2009/0166846 A1 | 7/2009 | Pratt et al. |
| 2010/0078818 A1 | 4/2010 | Ishizaka et al. |

(Continued)

FOREIGN PATENT DOCUMENTS

WO    WO 2009-142655    11/2009

OTHER PUBLICATIONS

Mallory, Glenn, et al., "Electroless Plating," Ed., 9, Noyes Publications/William Andrew Pub. (1990), pp. 1-56.

(Continued)

*Primary Examiner* — Brook Kebede
(74) *Attorney, Agent, or Firm* — Knobbe Martens Olson & Bear LLP

(57) ABSTRACT

Etched wafers and methods of forming the same are disclosed. In one embodiment, a method of etching a wafer is provided. The method includes forming a metal hard mask on the wafer using electroless plating, patterning the metal hard mask, and etching a plurality of features on the wafer using an etcher. The plurality of featured are defined by the metal hard mask.

30 Claims, 15 Drawing Sheets

U.S. PATENT DOCUMENTS

| | | |
|---|---|---|
| 2010/0090304 A1 | 4/2010 | Liu et al. |
| 2010/0210091 A1 | 8/2010 | Mauder et al. |
| 2011/0042803 A1 | 2/2011 | Chu |
| 2012/0153477 A1 | 6/2012 | Shen |

OTHER PUBLICATIONS

Li, Jun, et al., "The Influence of 2,2'-Dipyridyl on Non-Formaldehyde Electroless Copper Plating," Electrochemical Society Proceeding, 103 (2003). 1 page.

Li, Jun, et al., "The Deposition Characteristics of Accelerated Nonformaldehyde Electroless Copper Plating," Journal of the Electrochemical Society, 150 (8), pp. C558-0562 (2003).

Sengupta, K.K., et al., "Kinetics of Oxidation of Hypophosphite Ion by Au(III) in Hydrochloric Acid Medium", Polyhedron, vol. 2(10), pp. 983-986 (1983).

Fischer, A.C., et al., "Selective Electroless Nickel Plating on Oxygen-Plasma-Activated Gold Seed-Layers for the Fabrication of Low Contact Resistance Vias and Microstructures," pp. 472-475 (2010).

Khaldeev, G.V., et al., "Electrooxidation of the Hypophosphite Ion on a Palladium Electrode", Russian J. of Electrochem., vol. 36 (9), pp. 934-941 (2000).

Nishizawa, Koichiro, et al, "Stress Suppression of Backside Metal in GaAs Devices," CS Mantech Conference Proceedings, p. 271, May 17-20, 2010, Portland, Oregon, USA.

Search Report and Written Opinion of Aug. 3, 2012 for International Application No. PCT/US2011/064996, 11 pages.

* cited by examiner

ETCHED WAFERS AND METHODS OF FORMING THE SAME

BACKGROUND

1. Field

Embodiments of the invention relate to semiconductor processing and, in particular, to etching.

2. Description of the Related Art

Etching processes can be used to form vias and other structures on a substrate. For example, an etching process can be used for etching wafers in heterojunction bipolar transistor (HBT) or bipolar field effect transistor (BiFET) GaAs processes.

It can be desirable to minimize the geometries of features formed using etching processes. Furthermore, it can be desirable to reduce the frequency of maintenance and repair of an etcher, in order to improve throughput and to reduce manufacturing costs.

Accordingly, there is a need for improved methods of etching wafer features.

SUMMARY

In certain embodiments, the present disclosure relates to a method of etching a wafer, the method including forming a metal hard mask on the wafer using electroless plating, patterning the metal hard mask, and etching a plurality of features on the wafer. The plurality of features are defined by the metal hard mask.

In various embodiments, the plurality of features includes a plurality of vias. In a number of embodiments, the plurality of features includes a plurality of through-wafer vias.

In accordance with several embodiments, each through-wafer via has a depth ranging between about 80 μm to about 120 μm.

In certain embodiments, the wafer includes a plurality of transistors on a first side. According to some embodiments, the etching the plurality of features on the wafer comprises etching the plurality of features on a second side of the wafer opposite the first side.

In some embodiments, forming the metal hard mask on the wafer includes forming a seed layer, and forming a metal layer over the seed layer. In a number of embodiments, the metal layer is formed by electroless plating. In certain embodiments, the metal layer includes at least one of nickel (Ni), palladium (Pd) and gold (Au). According to some embodiments, the metal layer has a thickness ranging between about 0.5 μm to about 10 μm.

In certain embodiments, the seed layer is formed by electroless plating. According to some embodiments, the seed layer includes at least one of palladium (Pd), nickel (Ni), and nickel vanadium (NiV). In a number of embodiments, the seed layer has a thickness ranging between about 0.01 μm to about 0.5 μm.

In accordance with several embodiments, patterning the metal hard mask includes forming a photoresist layer over the metal hard mask, patterning the photoresist layer, and chemically etching the metal hard mask using the patterned photoresist layer.

In certain embodiments, the method further includes removing the patterned photoresist layer before etching the plurality of features on the wafer.

In some embodiments, the wafer is a GaAs wafer. According to certain embodiments, the wafer has a diameter greater than or equal to about 150 mm. In various embodiments, the wafer has a thickness less than about 200 μm. In accordance with some embodiments, the wafer is bonded to a carrier substrate. In a number of embodiments, the carrier substrate is a sapphire substrate.

In certain embodiments, the present disclosure relates to an integrated circuit. The integrated circuit includes a substrate, a plurality of transistors formed on a first surface of the substrate, a metal conductor formed on the first surface of the substrate and a metal hard mask disposed on a second surface of the substrate opposite the first surface, the metal hard mask having an opening. The integrated circuit further includes a through-wafer via in the substrate, the through-wafer via aligned with the opening of the metal hard mask, and a metal layer disposed over the second surface of the substrate including the through-wafer via and the metal hard mask.

In some embodiments, the metal hard mask includes a seed layer disposed on the second surface of the substrate and a metal layer disposed over the seed layer.

According to a number of embodiments, the metal layer includes nickel (Ni). In various embodiments, the metal layer has a thickness ranging between about 0.5 μm to about 20 μm. In certain embodiments, the seed layer includes palladium (Pd). In several embodiments, the seed layer has a thickness ranging between about 0.01 μm to about 0.5 μm.

In various embodiments, the plurality of transistors are electrically connected to form at least one power amplifier, the at least one power amplifier configured to provide a radio frequency signal to an antenna of a mobile device.

In some embodiments, the plurality of transistors includes at least one heterojunction bipolar transistor (HBT).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The headings provided herein, if any, are for convenience only and do not necessarily affect the scope or meaning of the claimed invention.

Figure 1:
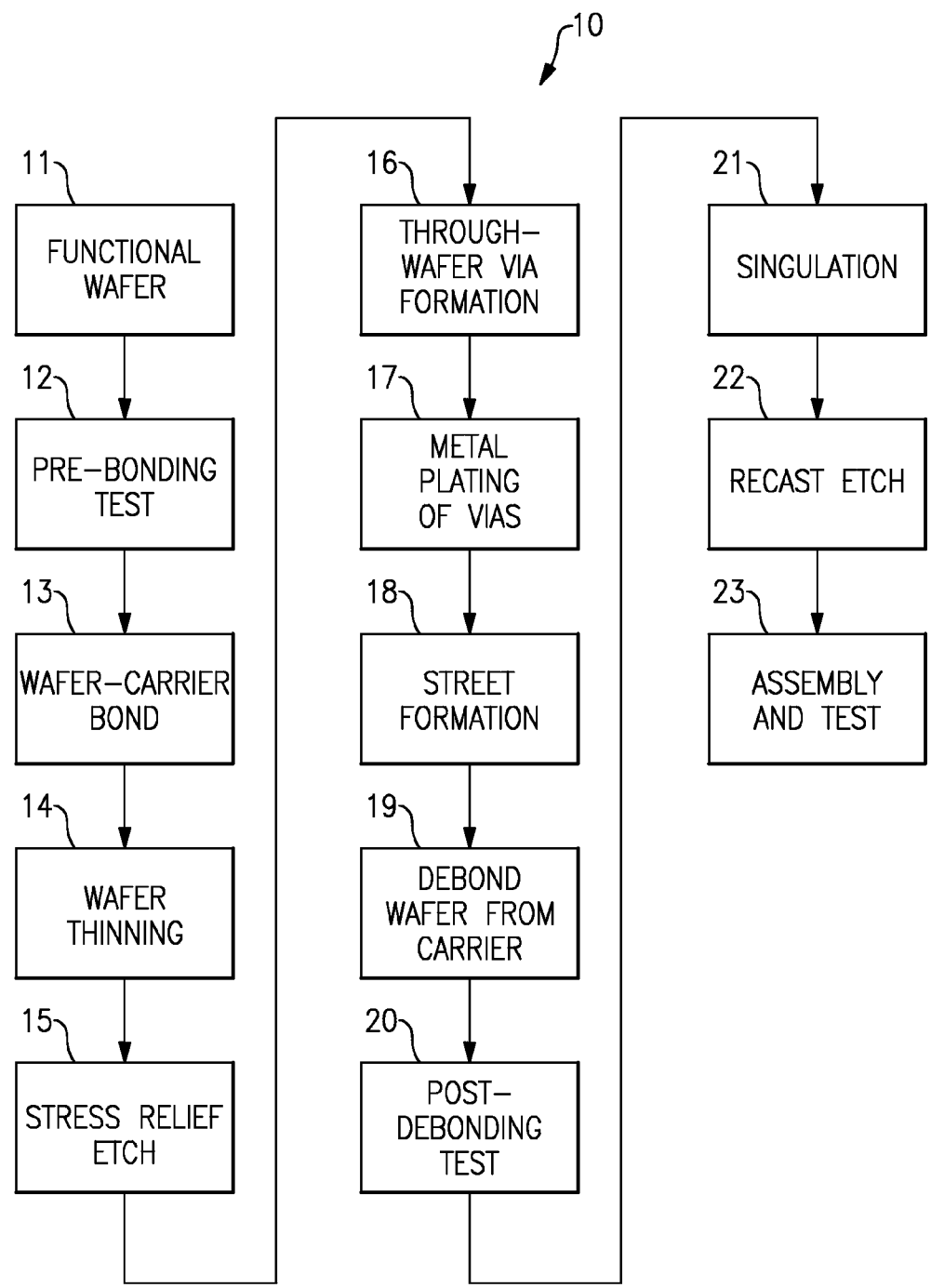
FIG. 1 shows an example sequence of wafer processing for forming through-wafer features such as vias.

Provided herein are various methodologies and devices for processing wafers such as semiconductor wafers. FIG. 1 shows an example of a process 10 where a functional wafer is further processed to form through-wafer features such as vias and back-side metal layers. As further shown in FIG. 1, the example process 10 can include bonding of a wafer to a carrier for support and/or to facilitate handling during the various steps of the process, and debonding of the wafer from the carrier upon completion of such steps. FIG. 1 further shows that such a wafer separated from the carrier can be further processed so as to yield a number of dies.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
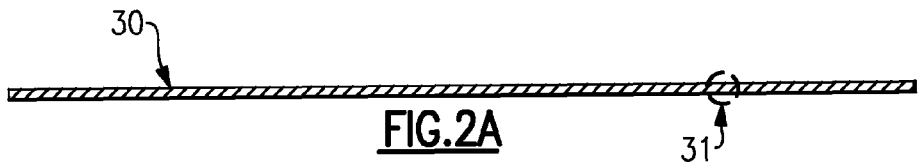
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
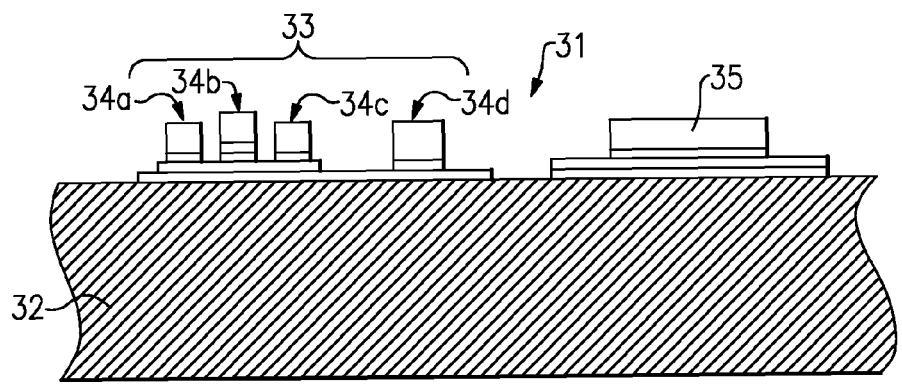

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed on the front side and the example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
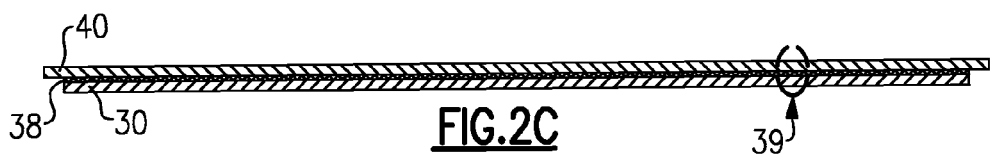

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding step 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections)

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate Diameter range | Carrier plate thickness range | Wafer size |
| --- | --- | --- |
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
| --- | --- | --- |
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
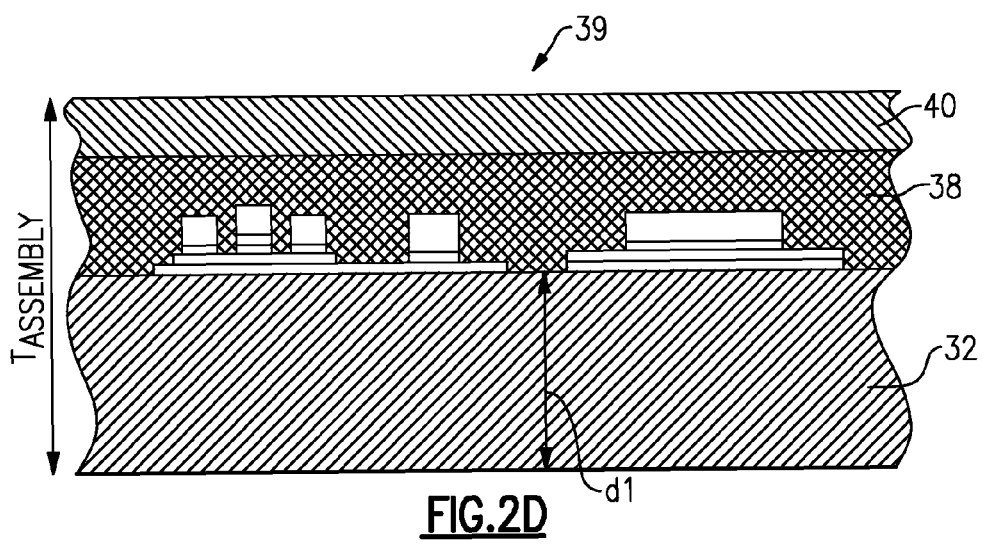

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of d1, and the carrier plate 40 has a generally fixed thickness (e.g., one of the thicknesses in Table 1). Thus, the overall thickness ($T_{assembly}$) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
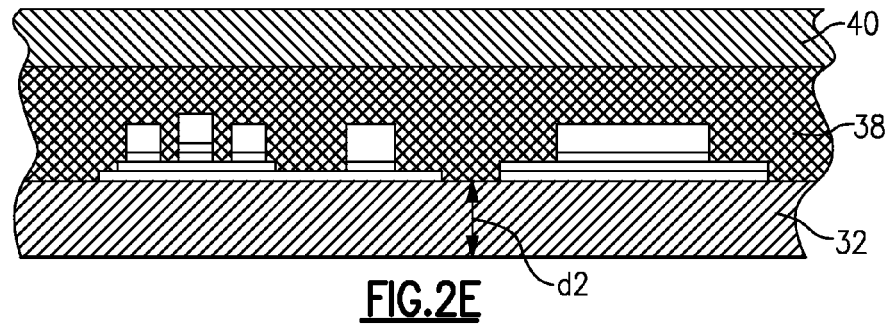

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via two-step grind with coarse and fine diamond-embedded grinding wheels) so as to yield an intermediate thickness-substrate (with thickness d2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an $O_2$ plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O_2$ and/or $H_2O$. Such an etching process can provide relief from possible stress on the wafer due to the rough ground surface.

Figure 2F:
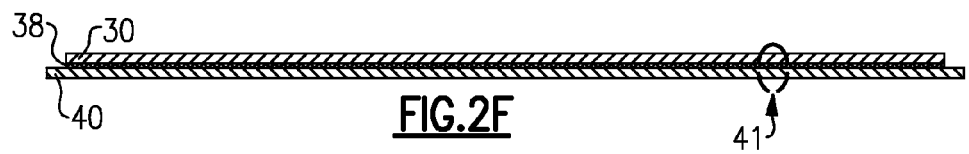
Figure 2G:
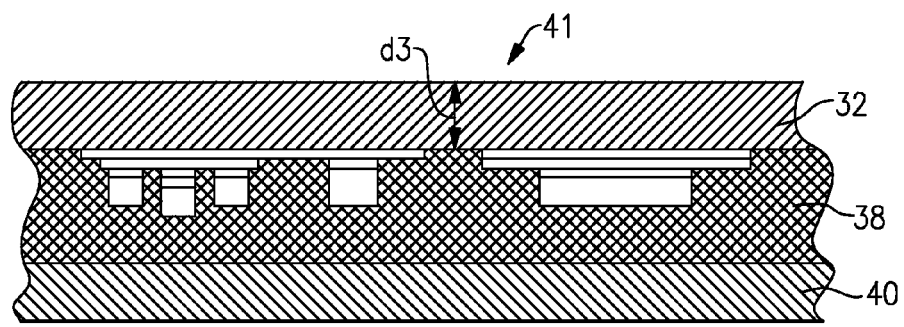

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of d3.

By way of an example, the pre-grinding thickness (d1 in FIG. 2D) of a 150 mm (also referred to as "6-inch") GaAs substrate can range from approximately 600 μm to 800 μm. The thickness d2 (FIG. 2E) resulting from the grinding process range from approximately 50 μm to 200 μm. The ash and etching processes remove approximately 5 μm to 10 μm of the rough surface (d3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
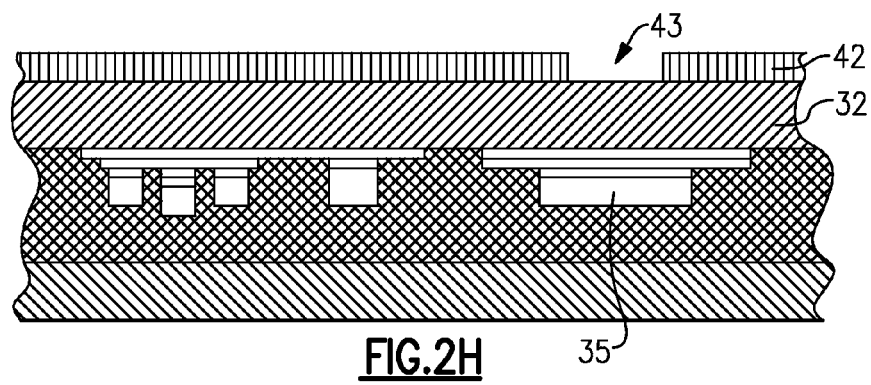
Figure 2I:
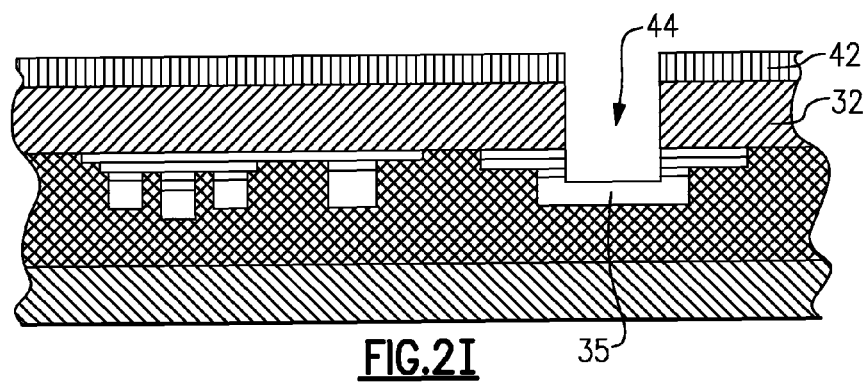
Figure 2J:
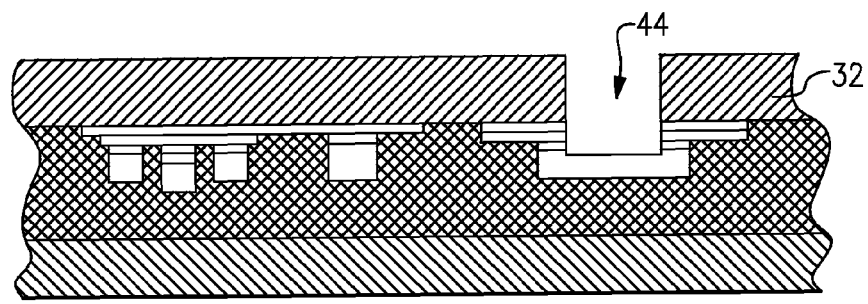

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side. Furthermore, although an example photolithographic method of etching an opening in forming one or more features will be described in more detail below, other methods can alternatively or additionally be implemented. For example, a metal hard mask can be used in etching one or more features, such as the through-wafer via 44, into the wafer 30. One such metal hard mask may include a palladium seed layer and a nickel barrier layer.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness ranging from about 12 μm to 24 μm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. Other methods of forming a through-wafer via will be described below with reference to FIGS. 4A-6G. In various implementations, a desired shaped via can be an important design parameter for facilitating proper metal coverage therein in subsequent processes.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
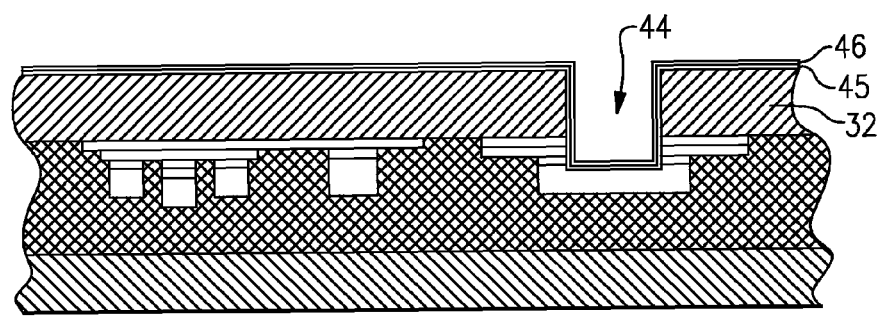
Figure 2L:
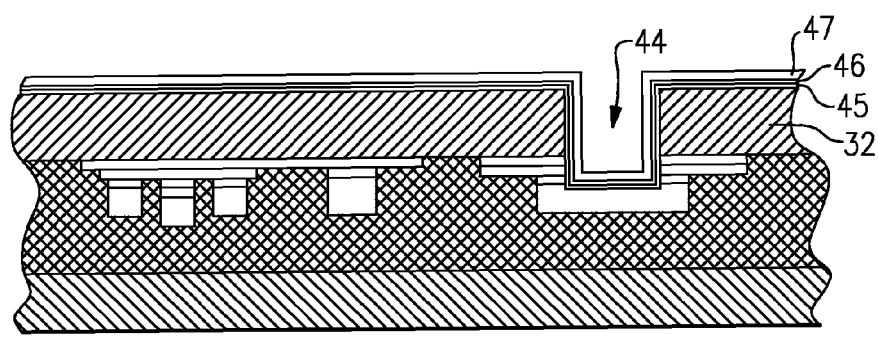

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 shown in FIG. 2L. In certain implementations, the thick metal layer 47 is a gold layer that can be formed by a plating technique. In other implementations, the thick metal layer 47 is a thick copper layer can be formed by a plating technique.

In certain implementations, the gold and/or copper plating processes can be performed after a pre-plating cleaning process (e.g., $O_2$ plasma ash and HCl cleaning). The plating can be performed to form a gold layer and/or a copper layer of about 3 μm to 6 μm to facilitate the foregoing electrical connectivity and heat transfer functionalities. The plated surface can undergo a post-plating cleaning process (e.g., $O_2$ plasma ash).

The metal layer formed in the foregoing manner can form a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
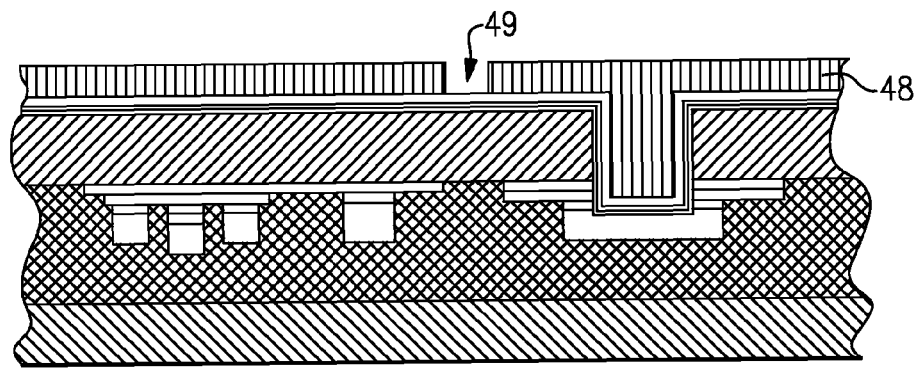
Figure 2N:
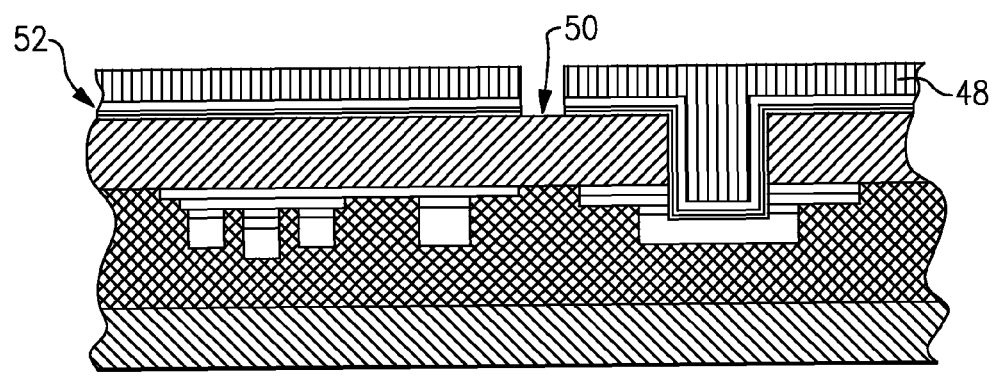
Figure 2O:
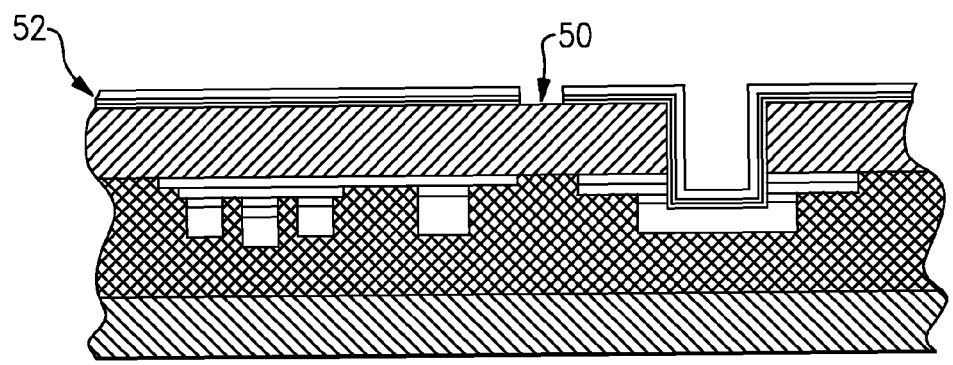

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., $O_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., $O_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
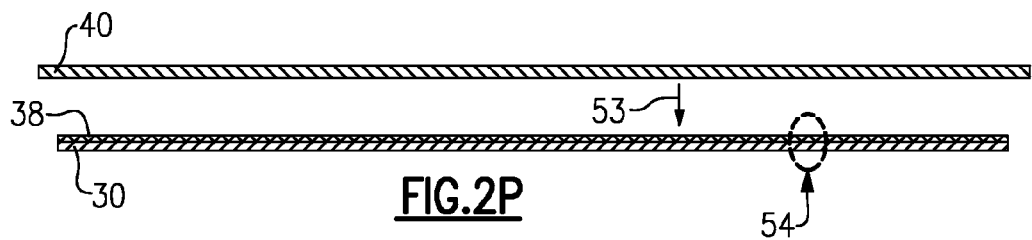

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature ranging from about 135° C. to 180° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
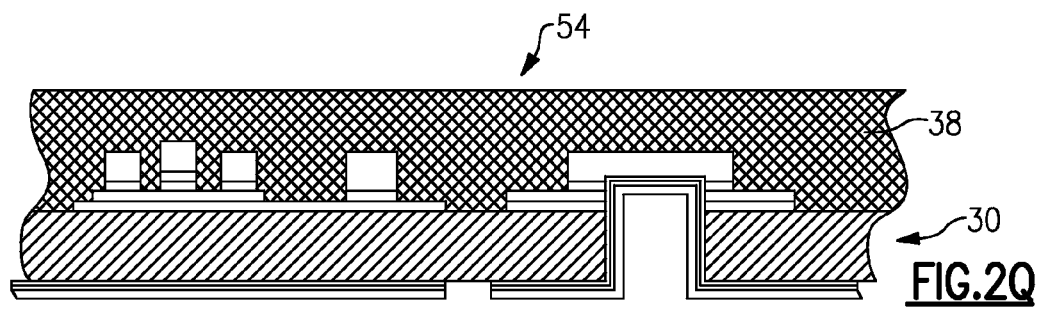

In FIGS. 2P and 2Q, the adhesive layer 38 is depicted as remaining with the wafer 30 instead of the carrier plate 40. It will be understood that some adhesive may remain with the carrier plate 40.

Figure 2R:
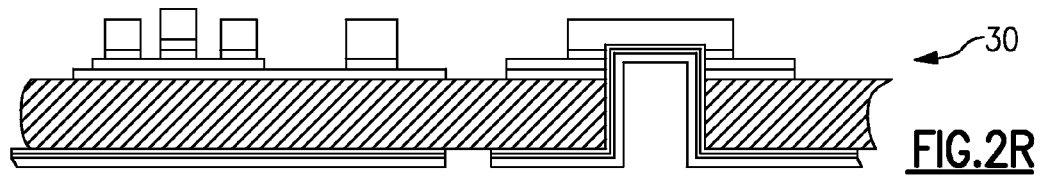

FIG. 2R shows the adhesive 38 removed from the front side of the wafer 30. The adhesive can be removed by a cleaning solution (e.g., acetone), and remaining residues can be further removed by, for example, a plasma ash (e.g., $O_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
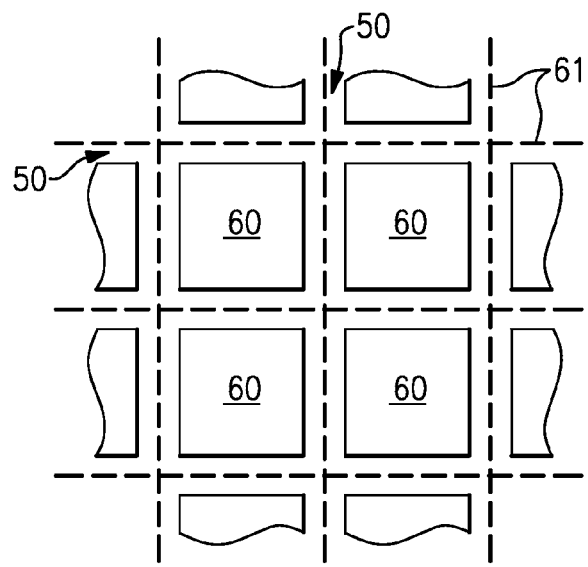

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
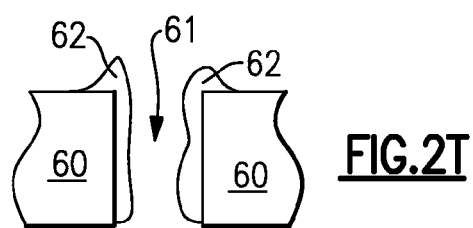

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
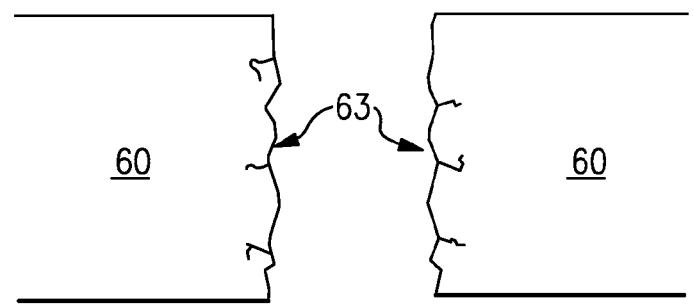
Figure 2V:
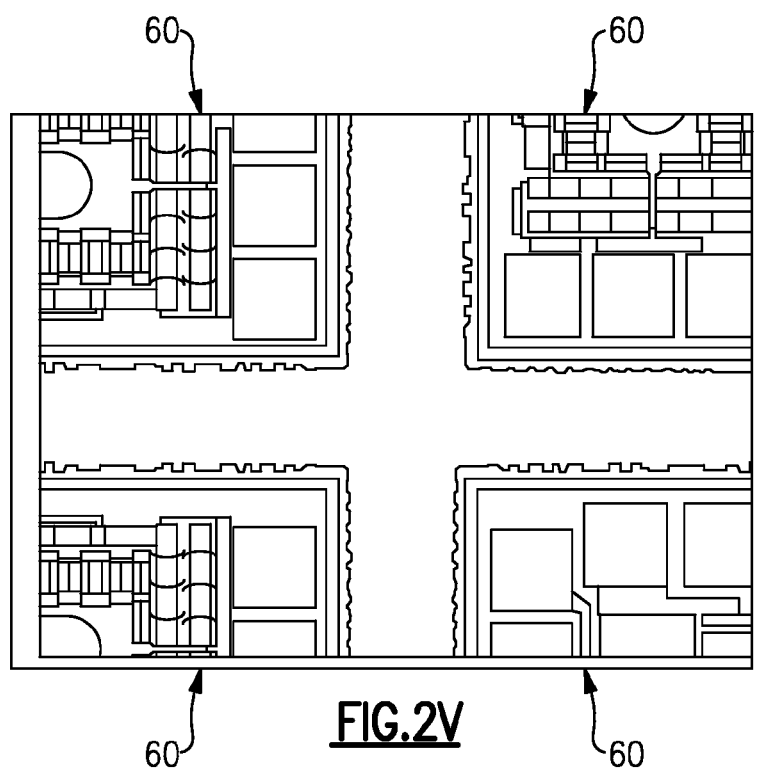

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

Overview of an Example Etching System

Figure 3A:
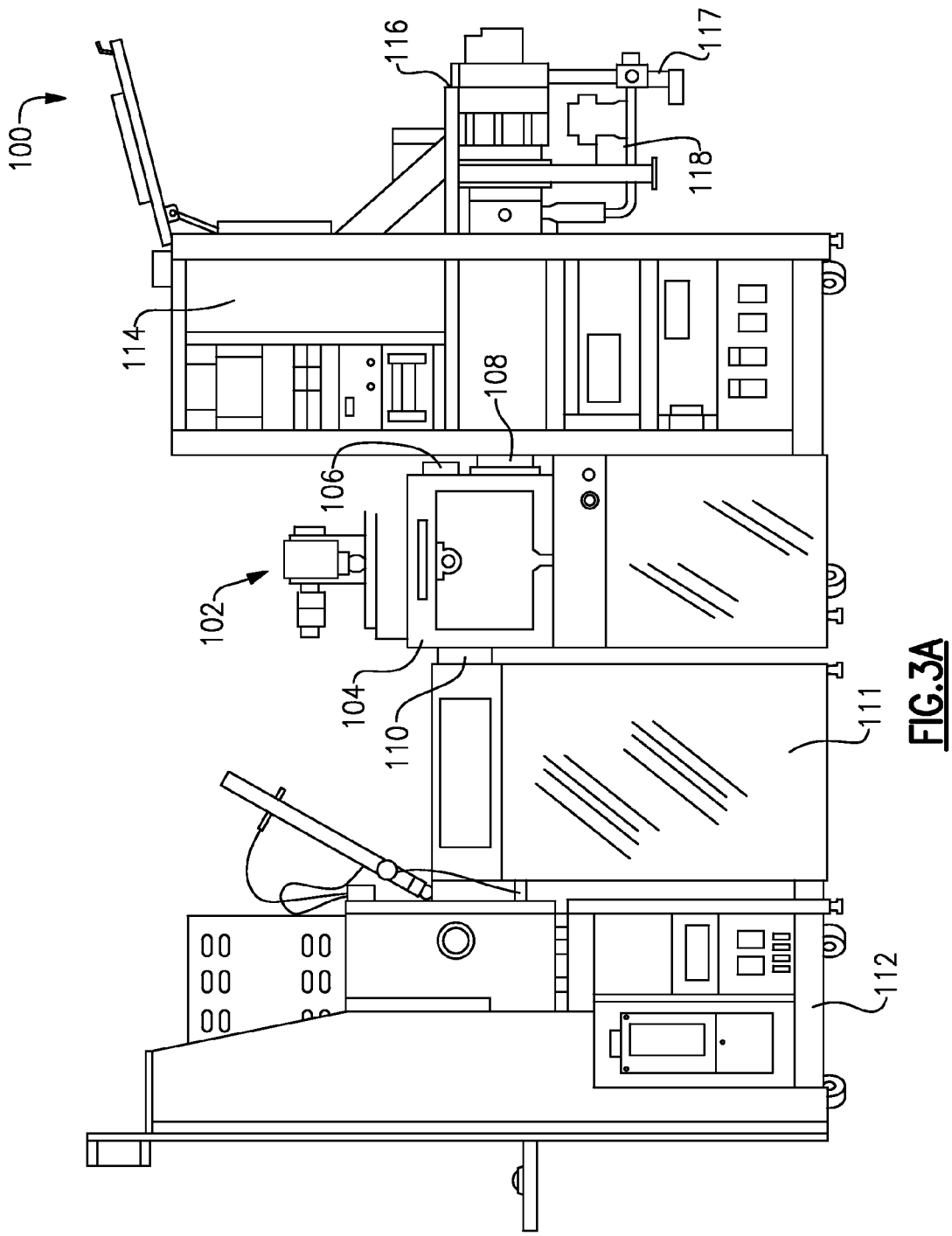
FIG. 3A is a schematic illustration of one example of an etching system.

FIG. 3A is a schematic illustration of one example of an etching system 100. The illustrated etching system 100 includes a plasma etcher 102, a transfer module 111, a load module 112, a gas source module 114, a molecular pump 116, a byproduct exhaust line 117, and a pressure channel 118. As illustrated, the plasma etcher 102 includes an external housing 104, a gas source channel 106, an exhaust channel 108, and a loading channel 110. The etching system 100 can be used in the through-wafer via formation process (block 16) of the process 10 of FIG. 1.

The load module 112 can be used for loading wafers into the etching system 100. For example, an operator can insert one or more wafers into a first end of the load module 112 for processing. Once loaded into the load module 112, the wafers can be transferred using a robot into the transfer module 111, which can be pressure controlled. The wafers can be loaded from the transfer module 111 into the plasma etcher 102 through the loading channel 110 using robotics. After processing, the wafers can be removed from the load module 112 in a similar manner. Although the load module 112 is illustrated as servicing a single plasma etcher 102, in certain embodiments, the load module 112 can be connected to a plurality of plasma etchers and transfer modules.

The plasma etcher 102 can be employed to form features using a variety of semiconductor processes. For example, the plasma etcher 102 can be used in HBT GaAs or BiFET GaAs processes to form through-wafer vias or other features.

The housing 104 can aid in creating a sealed chamber for processing samples. The samples can be, for example, GaAs wafers having a diameter at least about 6 inches. A plasma gas source can be supplied to the interior chamber of the plasma etcher 102 using the gas source channel 106 and the gas source module 114. The exhaust channel 108 can be connected to one or more pumps and can be used to remove gases from within the plasma etcher 102. For example, the molecular pump 116 can be configured to remove byproducts using the exhaust channel 117, and pressure control can be achieved using the pressure channel 118.

The plasma etcher 102 can receive a plasma source gas from the gas source channel 106. The plasma source gas can include, for example, a gas containing chlorine such as $Cl_2$ and/or $BCl_3$. A wafer can be positioned within the plasma etcher 102, and the plasma source gas can be stimulated by a radio frequency power source to generate ions for use in etching features on the wafer, as will be described in detail below with respect to FIG. 3B.

The exhaust channel 108 can aid in removing gases from the interior of the plasma etcher 102. For example, one or more pumps can be connected to the exhaust channel 108, and the exhaust channel 108 can be used as a channel for removing both particulates resulting from the etch process, as well as plasma source gases. In certain processing systems, the exhaust channel 108 can be connected to a pump having a limited pumping capability. For example, the pumping rate of the molecular pump 118 can be limited by the design of the pump, and/or the pump can be connected to an exhaust line 117 having a limited discharge capability.

Etching features on a wafer using a photoresist mask can result in particulates building up in the plasma etcher 102, which can impact the etch rate and can clog the exhaust line of the plasma etcher. Although particulate build-up can be removed by cleaning the plasma etcher, cleaning the plasma etcher can necessitate the plasma etcher to be taken down from the processing line, thereby reducing wafer throughput. Particulate buildup can be exacerbated when forming relatively large features, such as through-wafer vias, since relatively large features can use relatively thick photoresist masks.

Figure 3B:
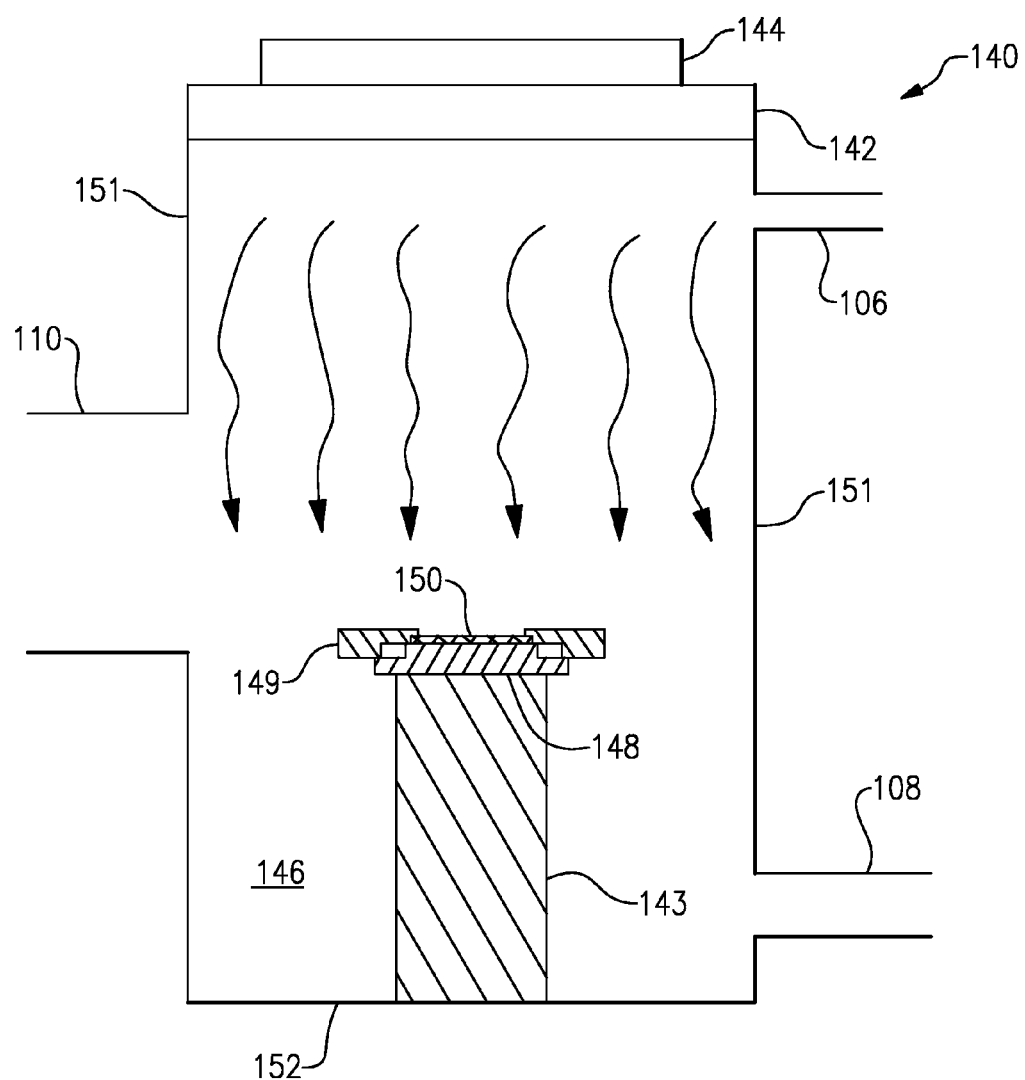
FIG. 3B is a cross-section of one example of a plasma etcher for use with the etching system of FIG. 3A.

FIG. 3B is a cross-section of one example of a plasma etcher for use with the etching system of FIG. 3A. The plasma etcher 140 includes a gas source channel 106, an exhaust channel 108, a loading channel 110, an anode or first electrode 142, a cathode or second electrode 143, a power source 144, a chamber 146, a feature plate 148, a clamp 149, chamber walls 151, and chamber bottom 152. The plasma etcher 140 can be used to etch features on a wafer 150, such as through-wafer vias or other structures. The wafer 150 can be a GaAs wafer, and can be bonded to a carrier substrate, such as a sapphire substrate, to aid in forming the features on the wafer 150. In some instances, the wafer 150 can have a diameter of at least 6 inches.

The gas source channel 106 can be used to supply a plasma gas source to the chamber 146, as described above. The plasma source gas can include, for example, a gas containing chlorine such as $Cl_2$ and/or $BCl_3$. The power source 144 can apply a radio frequency voltage between the first and second electrodes 142, 143. The power source 144 can include, for example, induction coils or any other suitable RF power source. The power source 144 can apply an RF voltage between the first and second electrodes 142, 143, which can stimulate the plasma source gas within the chamber 146. The exhaust channel 108 can aid in removing gases from the interior of the plasma etcher 102. Additional details of the exhaust channel 108 and the gas source channel 106 can be as described above.

The power source 144 can ionize a portion of the plasma source to form plasma containing electrons and positive ions. The electrons can respond to the varying electric fields produced by the RF power source 144, which can lead to the creation of sheath region near the electrodes having a net positive charge when averaged over a period of the RF driving voltage. The creation of the positive charged sheath region can create an electric field from the plasma to the wafer 150. Thus, ions 134 in the plasma can be accelerated by an electric field toward the wafer 150. The ions 134 can bombard the wafer 150, and can enhance chemical processes occurring at the surface of the wafer 150. Employing plasma can aid in processing wafers at relatively low temperatures compared to a process using only chemical methods.

The plasma etcher 140 can process samples in the chamber 146 at a relatively low pressure, such as a pressure of less than about 1 Torr. Processing wafers at a relatively low pressure can aid in delivering activation energy to a surface of a wafer using ions, while reducing the heat delivered to the wafer.

The chamber 146 includes chamber walls 151 and chamber bottom 152. The chamber walls 151 and the chamber bottom 152 can be formed of any suitable material, including, for example, alumina. The thickness of the chamber walls 151 and chamber bottom 152 can be selected to provide sufficient structural rigidity to the chamber 146.

The plasma etcher 140 includes the feature plate 148 for holding the wafer 150. The feature plate 148 can be used to process a wide variety of samples, including wafers bonded to a nonconductive carrier, such as a sapphire carrier. The clamp 149 can be provided to aid in holding wafer 150 during processing. The clamp 149 can be, for example, alumina, and can be configured to mate with the feature plate 148. The clamp 149 can include recesses matched to the wafer 150 and/or the feature plate 148, to aid in holding the wafer 150 during processing.

When etching relatively large features in the wafer 150, such as through-wafer vias, a relatively large amount plasma source gas can be provided to the chamber 146 and a relatively large power can be applied by the power source 144. This can permit the etching process to complete in a relatively short time, and can increase throughput of the plasma etcher 140. However, the relatively large amount of plasma source gas and power can increase the flux of ions and the amount of etch particulates and effluent gases, including photoresist residues, which can strain pumping from the exhaust channel 108 and can increase a need for cleaning the plasma etcher 140.

Overview of Metal Hard Masks

In various embodiments described herein, a metal hard mask can be used as a masking layer for forming a feature on a wafer, such as a through-wafer via. By employing a metal hard mask, a photoresist layer can be omitted, thereby reducing particulate build-up in an etcher, such as a plasma etcher. Thus, employing a metal hard mask can reduce the frequency of cleaning of the etcher, thereby improving throughput.

Figure 4A:
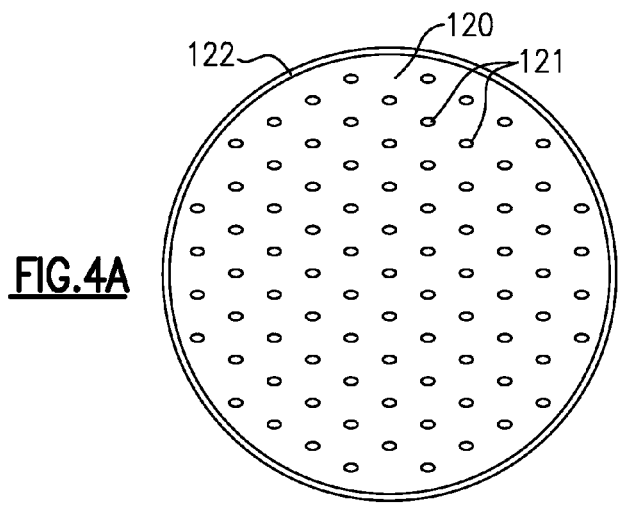
FIG. 4A is a schematic plan view of an etched wafer in accordance with one embodiment.

FIG. 4A is a schematic plan view of an etched wafer 120 in accordance with one embodiment. The wafer 120 includes features 121 formed by an etcher, such as the plasma etcher 102 of FIG. 3. The wafer 120 can be, for example, a GaAs wafer. The wafer 120 can be thinned to a relatively small thickness, such as a thickness less than about 200 µm. In certain embodiments, the wafer 120 can be bonded to a carrier plate or substrate 122, such as a sapphire substrate, to aid in processing the wafer 120 for etching. For example, the carrier substrate 122 can provide structural support to a thinned wafer, thereby helping to prevent breakage or other damage to the wafer 120.

The features 121 can be, for example, vias, trenches or other formations. For example, as will be described below with reference to FIGS. 4B-4C, the features 121 can include through-wafer vias.

Figure 4B:
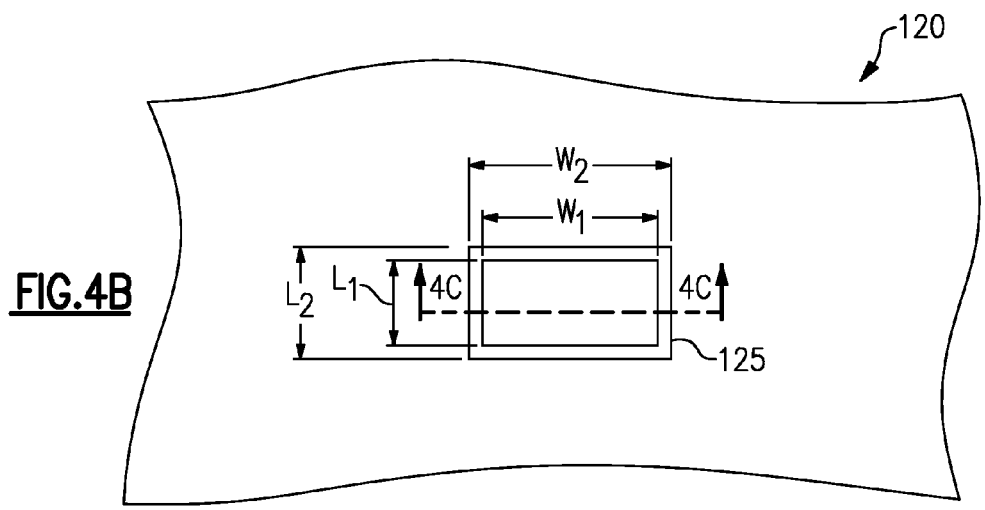
FIG. 4B is a top plan view of a portion of the wafer of FIG. 4A.
Figure 4C:
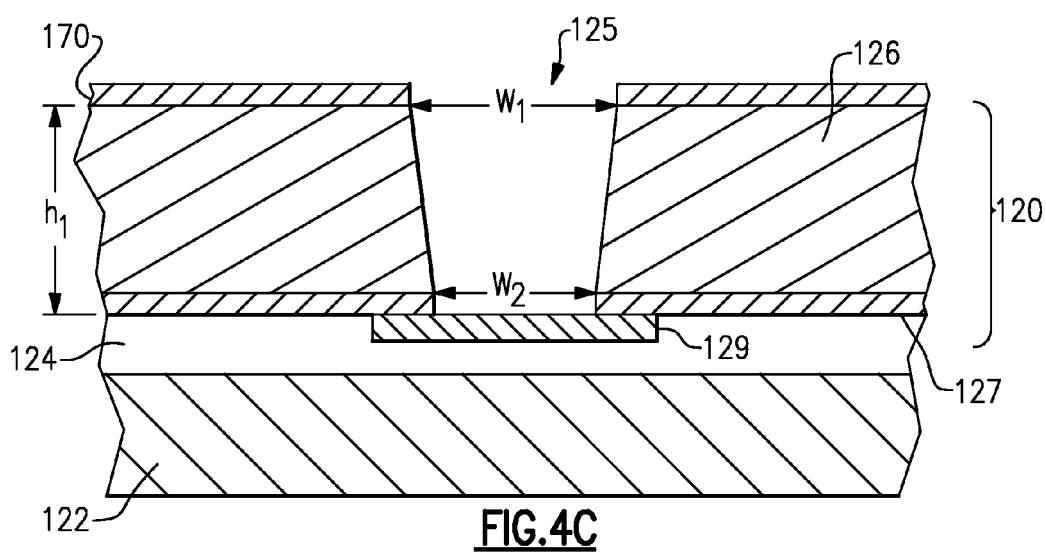
FIG. 4C is a cross section of the wafer of FIG. 4B taken along the line 4C-4C.

FIG. 4B is a partial magnified plan view of a portion of the wafer 120 of FIG. 4A. FIG. 4C is a partial cross section of the wafer 120 of FIG. 4B taken along the line 4C-4C. The wafer 120 includes a substrate 126, an epitaxial layer 127, a conductive layer 129, and a metal hard mask 170. An adhesive 124 has been provided on a first major surface of the wafer 120, and has been used to bond a carrier substrate 122 to the wafer 120. The adhesive can be, for example, any suitable polymer or wax. The wafer 120 includes a through-wafer via 125 from the second major surface of the wafer 120 to the conductive layer 129. A metal hard mask 170 has been formed on a second surface of the wafer 120, and has been used as a mask for etching a through-wafer via 125 from the second major surface of the wafer 120 to the conductive layer 129. Thus, rather than employing a photoresist mask to form the through-wafer via 125, the illustrated wafer 125 has been formed using the metal hard mask 170.

The through-wafer via 125 can undergo subsequent processing steps. For example, the through-wafer via 125 can undergo a subsequent plating step in which a metal is provided over the wafer 120, including the through-wafer via 125, to aid in providing electrical connectivity between the first and second surfaces of the wafer 120. In contrast to a conventional through-wafer via process employing a photoresist mask to define the through-wafer via, the mask used to define the through-wafer via 125 need not be removed before plating the through-wafer via. Rather, the metal hard mask 170 can be used as a seed layer for a subsequent plating step, thereby reducing processing time of the wafer 125.

The wafer 120 can be, for example, a GaAs wafer having a diameter greater than at least about 6 inches and a (100) crystal orientation. The wafer 120 can have a variety of thicknesses, including, for example, a thickness ranging between about 80 µm to about 120 µm, for example, about 100 µm. As shown in FIG. 4C, the wafer 120 can be bonded using the adhesive 124 to the carrier substrate 122, which can be, for example, a sapphire substrate having a diameter larger than that of the wafer 120. The carrier substrate 122 can aid in processing the wafer 120, and can later be removed. However, in certain embodiments, the carrier substrate 122 and the adhesive 124 can be omitted.

The epitaxial layer 127 is formed on a first surface of the wafer 120, and can include, for example, a sub-collector layer, a collector layer, a base layer and/or an emitter layer to aid in forming heterojunction bipolar transistor (HBT) structures. The wafer 120 can include additional layers, such as one or more layers configured to form BiFET devices. The epitaxial layer 127 can have, for example, a thickness ranging between about 1.5 µm to about 3.5 µm. Although the wafer 120 is illustrated as including the epitaxial layer 127, in certain embodiments, the epitaxial layer 127 can be omitted.

The wafer 120 includes the conductive layer 129, which can be any suitable conductor, including, for example, gold. A portion of the conductive layer 129 can be positioned on below the through-wafer via 125, so as to permit a subsequently deposited conductive layer to make electrically contact between the first and second surfaces of the wafer 120. In one embodiment, the wafer 120 includes a plurality of transistors formed on the first major surface of the wafer 120 and a conductive ground plane formed on the second major surface of the wafer, and the through-wafer via is used to provide a robust electrical and thermal path between the transistors and the conductive ground plane.

The metal hard mask 170 has been provided on the second surface of the wafer 120 to aid in forming the through-wafer via 125. The metal hard mask 170 can include one or more layers and can be formed using an electroless plating process, as will be described in detail further below. In certain implementations, such as embodiments using the carrier substrate 122, electroless plating can be advantageous over other methods of forming the metal hard mask 170, such as sputter, since electroless plating need not employ an edge exclusion zone between the substrate 120 and the carrier 122 to prevent metal plating on the carrier. Removal of an edge exclusion zone near the boundary of the carrier 122 and the substrate 120 when viewed from above (see FIG. 4A) can increase protection of the edges of the substrate 120 near the boundary during a subsequent processing step, such as a dry etch. Additionally, electroless plating can be used to form a metal hard mask having improved conformity relative to other methods.

The metal hard mask 170 can have a variety of thicknesses, such as a thickness ranging between 0.1 µm to about 10 µm. By forming the metal hard mask 170 using an electroless plating process, the metal hard mask 170 can have a thickness greater than that associated with a sputter or other process that is limited to depositing layers of a relatively thin thickness. The metal hard mask 170 can be used to define additional features, including other through-wafer vias and/or other features.

The through-wafer via 125 can define a cavity in the wafer 120 having a first end and a second end, and the area of the first end can be less than the area of the second end. For example, the through-wafer via can include a first end in the wafer 120 having a width $W_1$ and a length $L_1$ and a second end having a width $W_2$ and a length $L_2$, where $W_2$ is greater than $W_1$ and $L_2$ is greater than $L_1$. In one embodiment, $W_2$ ranges between about 50 µm to about 70 µm, $L_2$ ranges between about 60 µm to about 90 µm, $W_1$ ranges between about 15 µm to about 60 µm, and $L_1$ ranges between about 15 µm to about 60 µm.

Although FIG. 4B is illustrated for the case of first and second openings having a cross-section that is substantially rectangular in shape, the through-wafer via 125 can have openings of any of a variety of shapes, including for example, oval, circular, or square shapes. Thus, in certain embodiments, the cross-section of the first opening can have an area ranging between about 225 µm$^2$ to about 3,600 µm$^2$, and cross-section of the second opening can have an area ranging between about 225 µm$^2$ to about 8,100 µm$^2$. The depth or height of the through-wafer via 125 can be relatively large. In one embodiment, the height $h_1$ of the through-wafer via 125 is in the range of about 80 µm to about 120 µm, for example, about 100 µm.

Providing the metal hard mask 170 can reduce sidewall etching of the through-waver via 125, thereby improving the anisotropy of the etch. Reducing sidewall etching can permit the fabrication of through-wafer vias having smaller dimensions.

Although a particular embodiment of the wafer was described above, the teachings described herein are applicable to a wide range of wafers and etched features.

Figure 5:
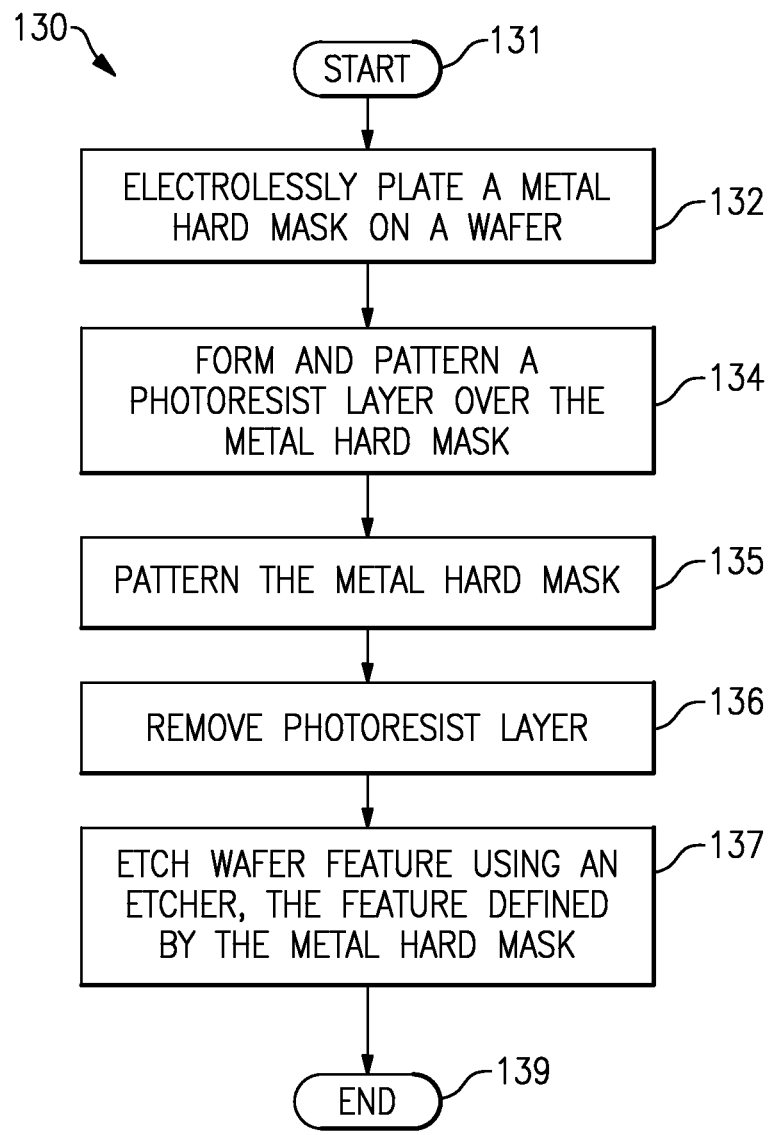
FIG. 5 is a flow chart of a method of etching a wafer in accordance with one embodiment.

FIG. 5 is a flow chart of a method of etching a wafer in accordance with one embodiment. It will be understood that the method may include greater or fewer operations and the operations may be performed in any order, as necessary. The illustrated method can be used to manufacture, for example, the through wafer via illustrated in FIGS. 4A-4C.

The method starts at 131. In an ensuing block 132, a metal hard mask is plated on a substrate using an electroless plating process. Plating the metal using the electroless process can include forming a seed layer, such as a palladium (Pd) seed layer, by submerging the substrate in a Pd solution. After forming the seed layer, the metal hard mask can be placed in a nickel (Ni) solution to complete formation of the metal hard mask.

Conventionally, electroless plating has been used to coat electronics on a printed circuit board, typically with an overlay of gold to prevent corrosion. Advantageously, as described herein, electroless plating can also be implemented in the processing of semiconductor substrates. For example, electroless plating may be used to form a metal hard mask for etching features on a substrate, such as through-wafer vias.

In contrast to electroplating, electroless plating can be a non-galvanic type of plating. Electroless plating can involve several simultaneous reactions in an aqueous solution, which can occur without external electrical power. Plating reactions can be accomplished via a chemical reduction process, which can depend upon the catalytic reduction process of metal ions, such as nickel (Ni) and/or palladium (Pd) ions, in an aqueous solution that includes a chemical reducing agent. For example, hydrogen (H) can be released by a reducing agent and oxidized thus producing a negative charge on the surface to be plated. In some implementations, the material to be plated may be cleaned by a series of chemicals, including acids and/or bases.

Electroless plating can include an auto-catalytic chemical technique used to deposit a layer comprising nickel or any other suitable metal on a substrate. Such a process can include the presence of a reducing agent reacting with the metal ions to deposit metal. The driving force for the reduction of metal ions and their deposition in electroless plating can be supplied by the chemical reducing agent in solution. This driving potential can be substantially constant at all points of the surface of the substrate, provided the agitation is sufficient to ensure a relatively uniform concentration of metal ions and reducing agents. As a result, electroless deposits can therefore be uniform in thickness over the substrate.

Electroless plating is a form of metallization, in which the substrate can be immersed in a metal salt solution and the metal ions in the solution can undergo an electrochemical oxidation-reduction process to selectively plate metal on catalytic surfaces, without a need for an external current source. A typical composition of an electroless plating bath includes metal salt, complexing agents, stabilizer and inhibitor, as well as one or more reducing agents. The one or more reducing agents can undergo an oxidation process near or on the catalytic surface, generating free electrons. The electrons can facilitate the reduction of metal ions in the solution on the catalytic substrate surface. A typical electroless nickel plating bath has nickel sulfate and uses hypophosphite as reducing agent. The overall reaction of electroless nickel plating can be represented by the following equation:

$$Ni^{2+} + 2H_2PO_2^- + 2H_2O \rightarrow Ni^0 + 2H_2PO_3^- + H_2 \quad (1)$$

In this equation, $Ni^{2+}$ can represent a nickel ion in the solution, $H_2PO^{2-}$ can represent a hypophosphite ion, $H_2PO^{3-}$ can represent a hypophosphate ion, and $H_2$ can represent hydrogen gas.

The anodic reaction of hypophosphite on the catalytic surface can be described by the following reaction:

$$H_2PO_2^- + H_2O \rightarrow H_2PO_3^- + H^+ + 2e^- \quad (2)$$

In this equation, $e^-$ can represent the free electron generated from the anodic reaction, which can be consumed in cathodic reactions, which can be represented by the following reactions:

$$Ni^{2+} + 2e^- \rightarrow Ni^0 \quad (3)$$

$$2H^+ + 2e^- \rightarrow H_2 \quad (4)$$

$$2H_2PO_2^- + 2H^+ + e^- \rightarrow P + 2H_2O \quad (5)$$

Reaction (2) can take place on a catalytic surface. Without the catalytic surface, reaction (2) may not take place and free electrons may not be generated. As a result, the electroless reaction may not continue. Whether a surface is catalytic for electroless plating purposes, to an extent, can depend on the nature of the solution used. A mechanism to explain whether a surface is catalytic, however, can be governed by the basic rules of thermodynamic, e.g., Gibbs free energy. In any electrochemical reaction where there are electrochemical cells formed, the Gibbs free energy $\Delta G^0$ should be negative, in the following equation:

$$\Delta G^0 = -nFE_{cell}^0 \quad (6)$$

In this equation, n can represent a number of moles of electrons transferred, F can represent the Faraday constant, and $E^0_{cell}$ can represent an electrochemical potential of the cell, which can describe the difference in electrochemical potentials between a cathodic reaction and an anodic reaction. If $E^0_{cell}$ is negative, then $\Delta G^0$ is positive and the reaction is not spontaneous.

In order to initiate the oxidation reaction (2) on the substrate surface, the hypophosphite and the substrate can form an electrochemical cell, in which the hypophosphite will undergo an oxidation reaction and the substrate material will undergo a reduction reaction. Once the reaction is initiated and free electrons are generated, nickel ions in the solution can be reduced by diffusing near or on the surface of the substrate and accepting the free electrons. Once reactions (3), (4), and (5) take place, the substrate reaction can stop and the material of the substrate can have little or no importance in the electroless plating.

Some advantages of electroless plating compared to electrolytic plating can include, for example, plating without using electrical power, forming uniform layers over complex surface geometries, deposits that are less porous with better barrier corrosion protection, plating deposits with zero or compressive stress, flexibility in plating volume and plating thickness, the ability to plate recesses and holes with a stable thickness, chemical replenishment can be monitored automatically, and complex filtration methods may not be required.

Additionally, by using an electroless process to form the metal hard mask, a metal layer of a relatively large thickness can be formed. Thus, in comparison to a sputter process, electroless plating can be used to form a metal hard mask of a relatively greater thickness, which can aid in forming through-wafer vias. In one embodiment, the metal hard mask formed in block 132 has a thickness in the range of about 1 μm to about 4 μm.

Employing an electroless process can also be advantageous when fabricating a feature on a wafer bonded to a carrier. For example, an electroless process can be performed at a relatively low temperature. Thus, an electroless plating process can avoid wafer steps associated with substantial heating, such as those in a sputter process, which can cause an adhesive binding the carrier and the wafer to melt. Additionally, an electroless process need not include an exclusion zone between the perimeter of the wafer and the carrier. By omitting an exclusion zone, protection near the edges of a wafer can be provided during subsequent processing steps, such as a dry etch step.

The method 130 of FIG. 5 continues at a block 134, in which a photoresist layer is formed and patterned over the metal hard mask. The photoresist layer can be formed using any suitable technique, including depositing photoresist using spin coating and subsequently patterning the photoresist using lithography.

In an ensuing block 135, the metal hard mask is patterned using the photoresist layer as a mask. The metal hard mask can be patterned using, for example, any suitable chemical process. For example, exposed portions of the metal hard mask can be patterned at an elevated temperature using a ferric chloride solution.

After patterning the metal hard mask, the method 130 continues at a block 130, in which the photoresist layer is removed. The photoresist layer 128 can be removed using any suitable process, such as a plasma ashing process employing a reactive species, such as oxygen (O) and/or fluorine (Fl).

The method 130 continues at a block 137, in which a wafer feature is etched using the metal hard mask. For example, a wafer can be etched in a plasma etcher to define through-wafer vias and/or other structures. Etching features using a metal hard mask can reduce particular build-up in an etcher relative to a process employing a photoresist mask. Particular build-up can impact the etch rate and can clog the exhaust line of the etcher, thereby necessitating frequent cleaning and reducing wafer throughput. Thus, by using a metal hard mask to etch a wafer feature, wafer throughput can be improved. The method ends at 139.

FIGS. 6A-6G are schematic cross-sections illustrating a manufacturing process for a wafer according to one embodiment.

Figure 6A:
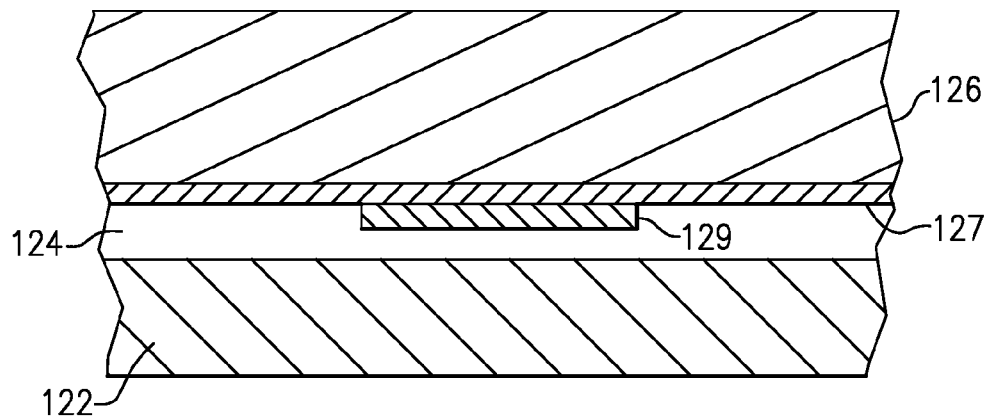
FIGS. 6A-6G are schematic cross-sections illustrating a manufacturing process for a wafer according to one embodiment.

FIG. 6A illustrates providing a wafer 126. The wafer includes an epitaxial layer 127 and a conductive layer 129. An adhesive 124 has been included on a first surface of the wafer 120, and has been used to bond a carrier substrate 122 to the wafer 120. The adhesive 124 has been used to attach the wafer 120 to the carrier 122. The first surface also includes a conductive layer 129, which can comprise, for example, gold or any other suitable metal. The wafer 120 can include a plurality of transistor and/or other electrical devices formed on the first surface of the wafer 120. Additional details of the wafer 120 can be as described earlier. Furthermore, although the wafer 120 has been shown as being attached to the carrier 122, in certain implementations, the carrier substrate 122 and the adhesive 124 can be omitted.

Figure 6B:
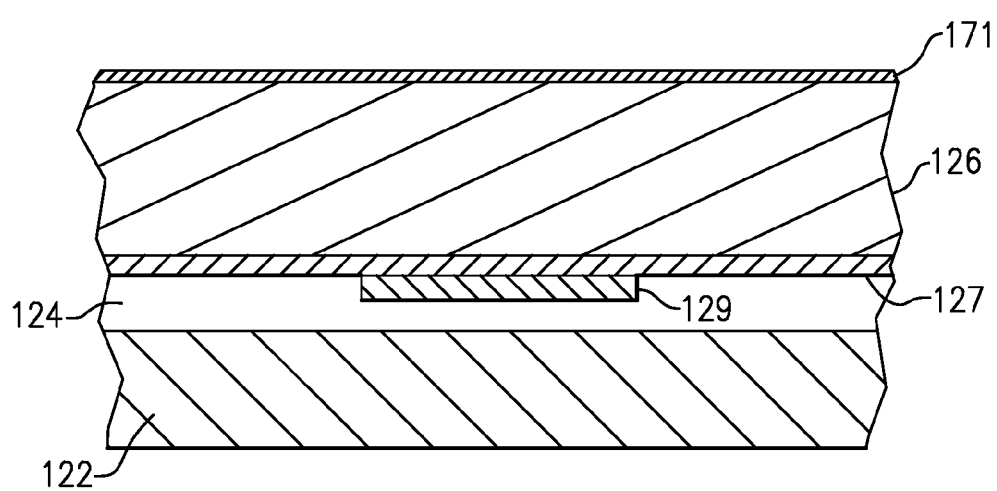

FIG. 6B illustrates forming a seed layer 171 on a second surface of the wafer 126 opposite the first surface. The seed layer 171 can be, for example a palladium (Pd), nickel (Ni), or nickel vanadium (NiV) seed layer, or any other metal suitable for plating on the wafer 126. The seed layer 171 can be formed using electroless plating methods, such as by submerging the substrate in a solution containing metal ions. In one embodiment, the seed layer has a thickness ranging between about 0.01 µm to about 0.5 µm.

Figure 6C:
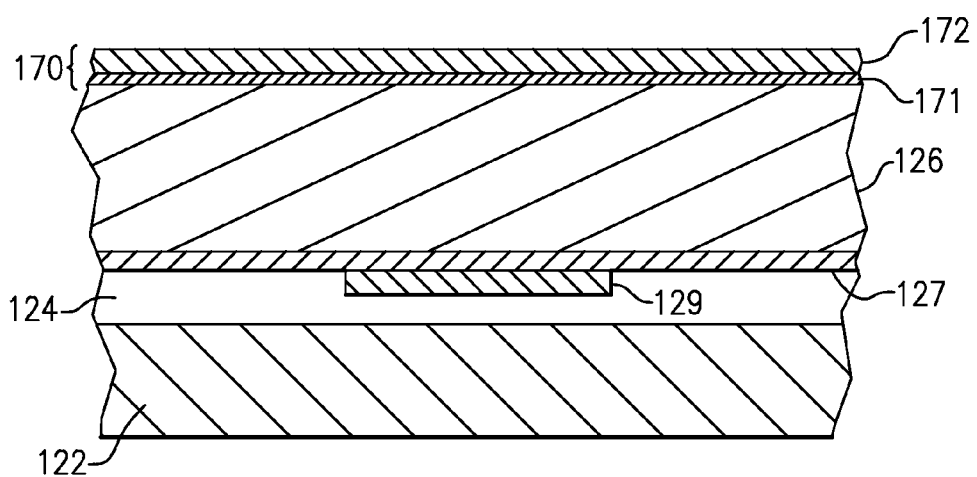

In FIG. 6C, a metal layer 172 has been formed over the seed layer 171 to form an unpatterned metal hard mask 170. The metal layer can be formed using an electroless plating process, and can comprise, for example, nickel (Ni), palladium (Pd), gold (Au) or any other metal that can be electrolessly plated. In one embodiment, the metal layer 172 has a thickness ranging between about 0.5 µm to about 10 µm.

Figure 6D:
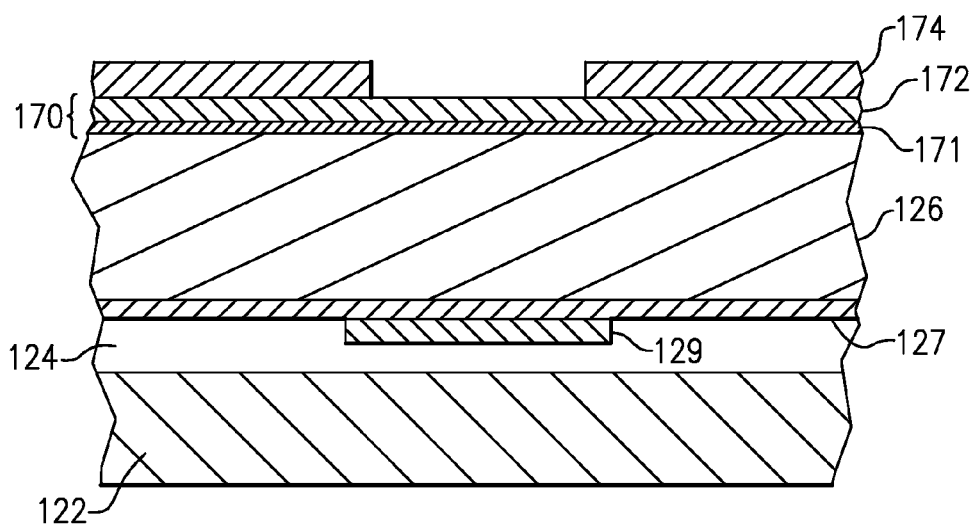

FIG. 6D illustrates forming and patterning a photoresist layer 174 over the unpatterned metal hard mask 170. As described earlier, the photoresist layer can be deposited and patterned in a variety of ways, including a spin coating step and a lithography step. The photoresist layer 174 can have a variety of thicknesses, such as a thickness ranging between about 0.5 µm to about 2 µm. As will be described below, the photoresist layer 174 is used to pattern the metal hard mask. Since the photoresist layer 174 can be relatively thin compared to a scheme in which the photoresist layer 174 is used as a mask in an etcher to define through-wafer vias, the photoresist layer 174 can be used to define relatively small vias. Reducing the dimensions of the through-wafer via can aid in shrinking the size of the integrated circuits formed on the wafer 126.

Figure 6E:
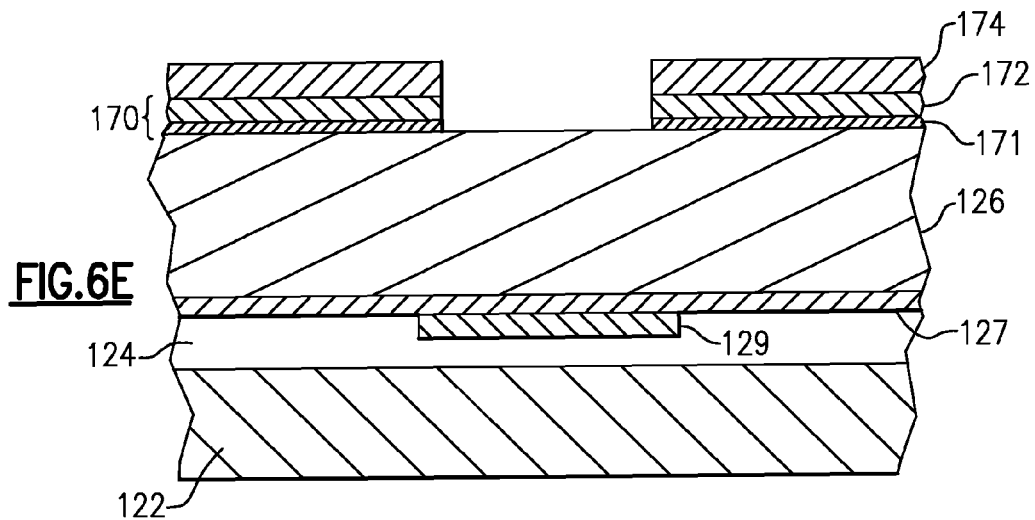

FIG. 6E shows patterning the metal hard mask 170 using the photoresist layer 174. The metal hard mask 170 can be patterned using chemical methods and/or any other suitable technique. The metal hard mask 170 includes an opening which can be used to define through-wafer vias and/or other structures.

Figure 6F:
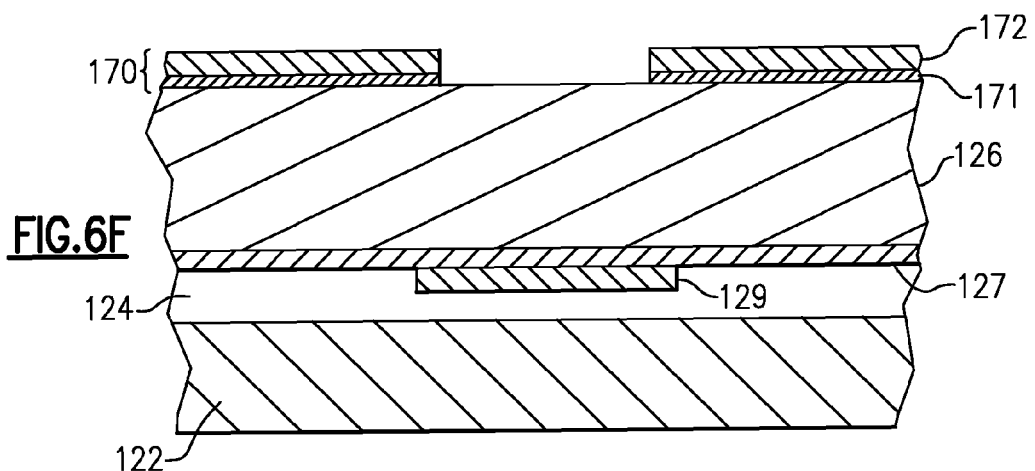

In FIG. 6F, the photoresist layer 174 has been removed. As described earlier, the photoresist layer 174 can be removed using, for example, ashing process employing a reactive species, such as oxygen and/or fluorine.

Figure 6G:
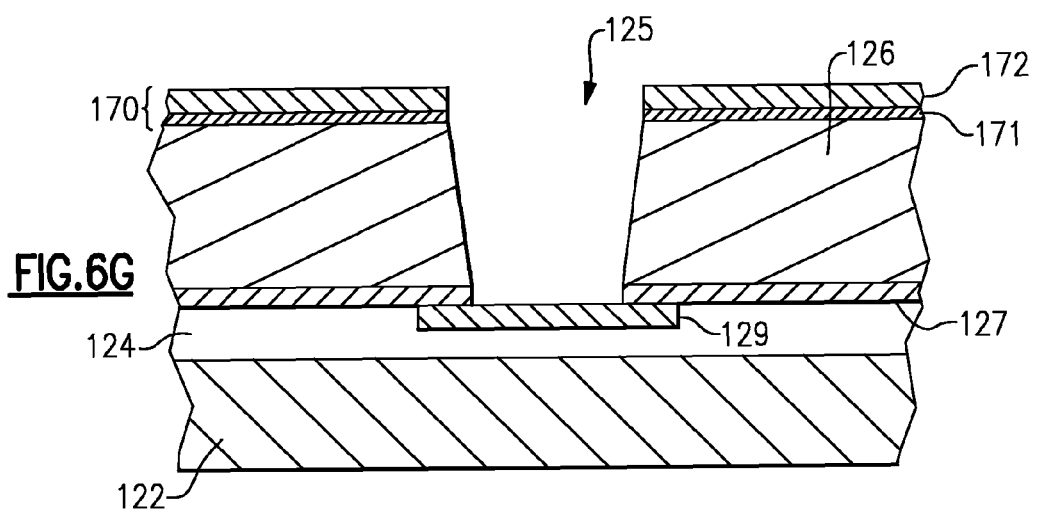

FIG. 6G illustrates forming a through-wafer via 125 in the wafer 126. The through-wafer via 125 can be formed using any suitable etcher, such as the plasma etcher illustrated in FIGS. 3A-3B. As persons having ordinary skill in the art will appreciate, the wafer 126 of FIG. 6G does not include the photoresist layer 174 of FIG. 6E. Thus, when forming the through-wafer via 125 of FIG. 6G, the etcher is not contaminated with particulates from a photoresist mask. Rather, the metal hard mask 170 is employed as a mask to define the illustrated through-wafer via 125. As illustrated in FIG. 6G, the through-wafer via is aligned with the opening in the metal hard mask 170 that was formed during the processing steps illustrated in FIG. 6E.

The metal hard mask 170 can reduce particulate build-up in the etcher, and thereby improve wafer throughput. Additionally, the metal hard mask 170 can have a thickness less than that of a photoresist layer used to define a through-wafer via of a similar size. Since mask layers of smaller thicknesses can be used to form wafer features having smaller dimensions, and since a metal hard mask can be used to form a through-wafer via having straighter sides relative to a through-wafer via formed using a photoresist layer, the metal hard mask 170 can be used to form smaller through-wafer vias, which can aid in reducing the size of integrated circuits formed on the wafer 126. For example, by reducing the size of the through-wafer via 125, the size of the conductive layer 129 can be reduced.

Figure 7:
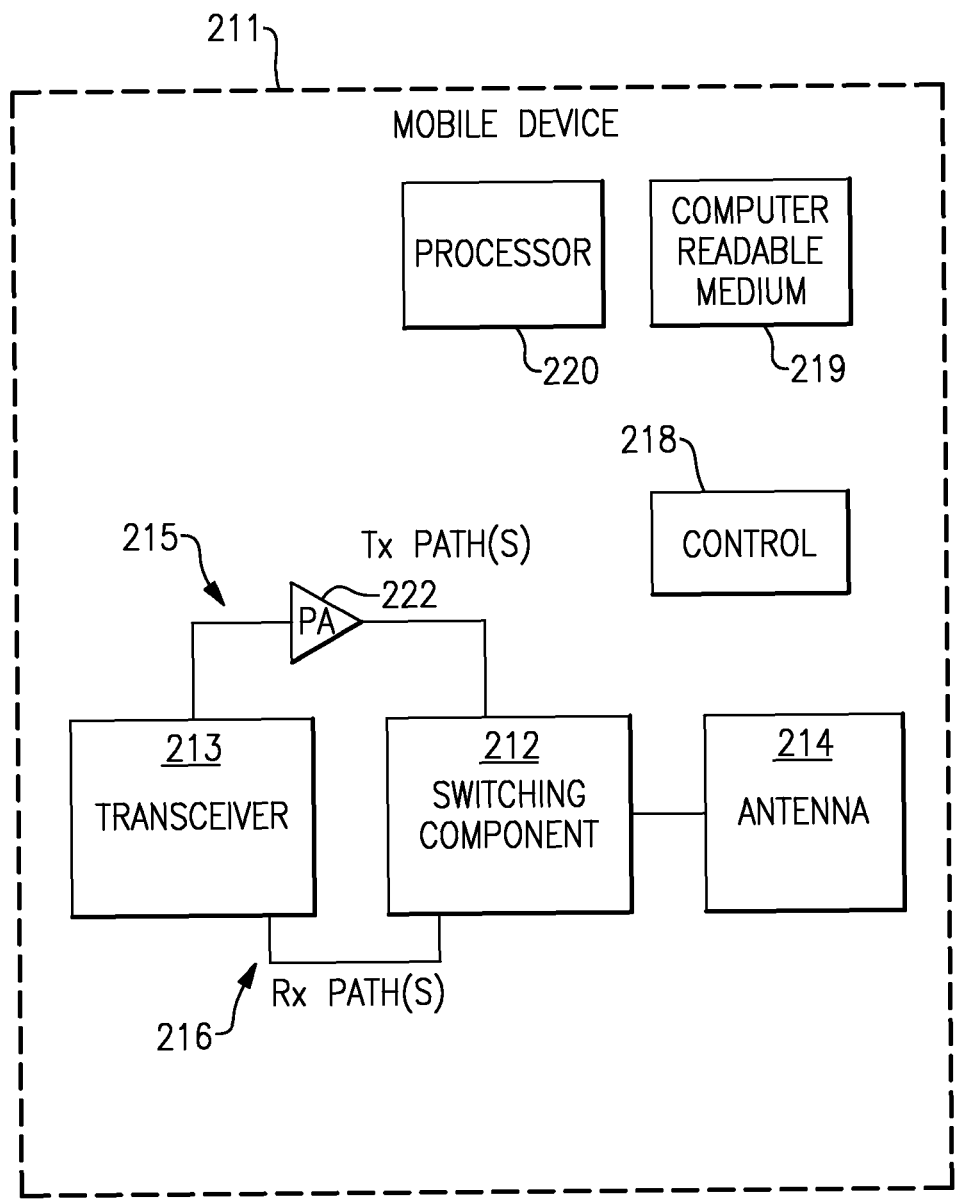
FIG. 7 schematically depicts a mobile device that can include an integrated circuit fabricated using a metal hard mask

FIG. 7 schematically depicts a mobile device 211 that can include an integrated circuit or die fabricated using a metal hard mask. The example mobile device 211 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

The mobile device 211 can include a transceiver component 213 configured to generate RF signals for transmission via an antenna 214, and receive incoming RF signals from the antenna 214. One or more output signals from the transceiver 213 can be provided to the switching component 212 using one or more transmission paths 215, which can be output paths associated with different bands and/or different power outputs, such as amplifications associated with different power output configurations (e.g., low power output and high power output) and/or amplifications associated with different bands. Additionally, the transceiver 213 can receive signal from the switching component 212 using one or more receiving paths 216.

The switching component 212 can provide a number of switching functionalities associated with an operation of the wireless device 211, including, for example, switching between different bands, switching between different power modes, switching between transmission and receiving modes, or some combination thereof. However, in certain implementations, the switching component 212 can be omitted. For example, the mobile device 211 can include a separate antenna for each transmission and/or receiving path.

In certain embodiments, a control component 218 can be included and configured to provide various control functionalities associated with operations of the switching component 212, the power amplifiers 217, and/or other operating component(s). Additionally, the mobile device 211 can include the processor 220 for facilitating implementation of various processes. The processor 220 can be configured to operate using instructions stored on a computer-readable medium 219.

The mobile device 211 can include one or more integrated circuits having features formed using a metal hard mask as described herein. For example, the mobile device 211 can include an integrated circuit having a power amplifier 222 for amplifying a radio frequency signal for transmission. The power amplifier 222 can be formed on an integrated circuit (for example, the integrated circuit or die 60 of FIG. 2S) using transistors, such as heterojunction bipolar transistors (HBTs), fabricated on a first surface of the integrated circuit. The integrated circuit can include a through-wafer via for electrically connecting the transistors formed on the first surface of the integrated circuit to a conductive ground planed disposed on a second surface of the integrated circuit opposite the first surface. The through-wafer via can be used to provide a robust electrical path and thermal between the transistors and the conductive ground plane. Additional details of the through-wafer via can be as described earlier.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of etching a wafer, the method comprising:
   forming a metal hard mask on the wafer using electroless plating;
   patterning the metal hard mask; and
   etching a plurality of features on the wafer, the plurality of features defined by the metal hard mask.

2. The method of claim 1, wherein the plurality of features includes a plurality of vias.

3. The method of claim 2, wherein the plurality of features includes a plurality of through-wafer vias.

4. The method of claim 3, wherein each through-wafer via has a depth ranging between about 80 μm to about 120 μm.

5. The method of claim 1, wherein the wafer includes a plurality of transistors on a first side.

6. The method of claim 5, wherein the etching the plurality of features on the wafer comprises etching the plurality of features on a second side of the wafer opposite the first side.

7. The method of claim 1, wherein forming the metal hard mask on the wafer includes forming a seed layer, and forming a metal layer over the seed layer.

8. The method of claim 7, wherein the metal layer is formed by electroless plating.

9. The method of claim 8, wherein the metal layer includes at least one of nickel (Ni), palladium (Pd) and gold (Au).

10. The method of claim 9, wherein the metal layer includes nickel.

11. The method of claim 9, wherein the metal layer has a thickness ranging between about 0.5 μm to about 10 μm.

12. The method of claim 9, wherein the seed layer is formed by electroless plating.

13. The method of claim 12, wherein the seed layer includes at least one of palladium (Pd), nickel (Ni), and nickel vanadium (NiV).

14. The method of claim 13, wherein the seed layer includes palladium.

15. The method of claim 13, wherein the seed layer has a thickness ranging between about 0.01 μm to about 0.5 μm.

16. The method of claim 1, wherein patterning the metal hard mask includes forming a photoresist layer over the metal hard mask, patterning the photoresist layer, and chemically etching the metal hard mask using the patterned photoresist layer.

17. The method of claim 16, further comprising removing the patterned photoresist layer before etching the plurality of features on the wafer.

18. The method of claim 1, wherein the wafer is a GaAs wafer.

19. The method of claim 18, wherein the wafer has a diameter greater than or equal to about 150 mm.

20. The method of claim 19, wherein the wafer has a thickness less than about 200 μm.

21. The method of claim 20, wherein the wafer is bonded to a carrier substrate.

22. The method of claim 21, wherein the carrier substrate is a sapphire substrate.

23. An integrated circuit comprising:
- a substrate;
- a plurality of transistors formed on a first surface of the substrate;
- a metal conductor formed on the first surface of the substrate;
- a metal hard mask disposed on a second surface of the substrate opposite the first surface, the metal hard mask having an opening;
- a through-wafer via in the substrate, the through-wafer via aligned with the opening of the metal hard mask; and
- a metal layer disposed over the second surface of the substrate including the through-wafer via and the metal hard mask.

24. The integrated circuit of claim 23, wherein the metal hard mask includes a seed layer disposed on the second surface of the substrate and a metal layer disposed over the seed layer.

25. The integrated circuit of claim 24, wherein the metal layer includes nickel (Ni).

26. The integrated circuit of claim 25, wherein the metal layer has a thickness ranging between about 0.5 μm to about 20 μm.

27. The integrated circuit of claim 25, wherein the seed layer includes palladium (Pd).

28. The integrated circuit of claim 27, wherein the seed layer has a thickness ranging between about 0.01 μm to about 0.5 μm.

29. The integrated circuit of claim 23, wherein the plurality of transistors are electrically connected to form at least one power amplifier, the at least one power amplifier configured to provide a radio frequency signal to an antenna of a mobile device.

30. The integrated circuit of claim 29, wherein the plurality of transistors includes at least one heterojunction bipolar transistor (HBT).

* * * * *